United States Patent [19]

Shigemoto et al.

[11] Patent Number: 5,080,979
[45] Date of Patent: Jan. 14, 1992

[54] RELEASE FILM COMPOSED OF A LAMINATE

[75] Inventors: Hiromi Shigemoto, Yamaguchi; Mikio Katagiri, Tokyo, both of Japan

[73] Assignee: Mitsui Petrochemical Industries, Ltd., Tokyo, Japan

[21] Appl. No.: 458,423

[22] Filed: Dec. 28, 1989

[30] Foreign Application Priority Data

Dec. 28, 1988 [JP] Japan ............................ 63-329008

[51] Int. Cl.⁵ .................................... B32B 27/08
[52] U.S. Cl. .................... 428/520; 428/516; 525/240
[58] Field of Search ............ 428/349, 516, 520; 525/240

[56] References Cited

U.S. PATENT DOCUMENTS 4,546,150 10/1985 Shigemoto .................. 525/240
4,876,156 10/1989 Hwo ............................ 428/349

FOREIGN PATENT DOCUMENTS 0219198 4/1987 European Pat. Off. .

OTHER PUBLICATIONS

Abstract of Japan, "World Patents Index Latest", Accession No. 81-916840, Week 50, Derwent Publication Ltd., (29-10-81).

Primary Examiner—Edith L. Buffalow
Attorney, Agent, or Firm—Sherman and Shalloway

[57] ABSTRACT

A release film composed of a laminate comprising
(A) a layer of a flexible polyolefin as an interlayer, and
(B) two layers of crystalline polymethylpentene formed on both sides of the interlayer.

5 Claims, 2 Drawing Sheets

RELEASE FILM COMPOSED OF A LAMINATE

This invention relates to a release film, and more specifically, to a release film composed of a laminate having moderate cushion property and excellent releasability which is used when a coverlay is bonded under heat and pressure by means of an adhesive to a flexible printed board having an electrical circuit formed therein.

It is well known that in the formation of a flexible printed board, a coverlay is provided on the board having an electrical circuit formed therein. The converlay is provided on one surface (when only one surface is printed), or both surfaces (when both surfaces are printed, or printing is effected on multiple layers), of the printed board by means of a heat-curable adhesive by hot pressing. To prevent the coverlay from being bonded to the hot plated during hot-pressing, a release film is used between the coverlay and the hot plate. Examples of the film are films of fluorine-containing polymers such as polytetrafluoroethylene, tetrafluoroethylene/hexafluoropropylene copolymer and polyvinyl fluoride and a polymethylpentene film.

On the electrical circuit (copper foil) surface formed on the board, the printed area differs in height from the non-printed areas. Accordingly, when that surface is covered with a film-like coverylay, a gap forms in the non-printed area, and air-enclosed in the space between the surface and the coverylay oxidizes the copper circuit with time, and markedly decreases its life. Furthermore, in the flexible printed board, terminal portions are not covered with a converlay for electrical connection with other electrical component parts, and the copper circuits in the connecting portions becomes bare. When the printed board is to be coated with a coverlay excepting the bare terminal portion, the adhesive applied to the coverlay is melted by the hot press and frequently flows onto the surface of the copper circuit at the bare terminal portions. As a result, the surface of the copper circuit is covered with the layer of the adhesive, and causes malfunction of electrical connections. The above-mentioned release films now in use can achieve the purpose of bonding the coverlay to the hot plate, but cannot still obviate the formation gaps in the non-printed areas during molding and prevent contamination of the bare surface of the copper circuit by the molten adhesive.

On the other hand, a surface-roughned film or sheet of poly-4-methyl-1-pentene is known for use not as a release film but for surface roughning of tha unclad surface of one-surface metal clad laminate used in the production of a printed board (Japanese Laid-Open Patent Publication No. 32031/1987).

It is an object of this invention to provide a release film composed of a multilayered laminate.

Another object of this invention is to provide a mold release film suitable for use in forming a flexible printed board, which, in the molding of a flexible printed board, prevents the coverlay from being melt-bonded to the hot plate, and the flowing adhesive from adhering to other parts, does not lead to the formation of gaps in the non-printed areas of the printed board, and further prevent contamination of the exposed surface of the copper circuit by the adhesive that melts and flows.

Other objects of the invention along with its advantages will become apparent from the following description.

According to this invention, the above objects and advantages of the invention are achieved by a release film composed of a laminate, said laminate comprising (A) a layer of a flexible polyolfein as an interlayer, and (B) two layers of crystalline polymethylpentene formed on both sides of the interlayer.

In the accompanying drawings.

Figure 1:
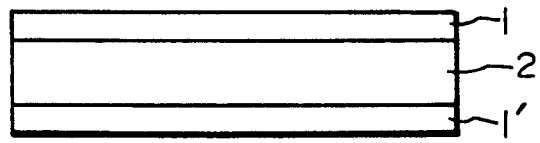
FIG. 1 shows a sectional view of one example of the release film of the invention.
Figure 2:
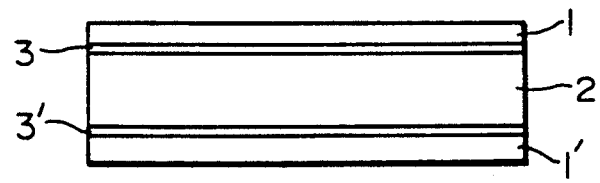
FIG. 2 is a sectional view of another example of the release film of the invention.

In FIG. 1, the release film is composed of an interlayer 2 of a flexible polyolefin and layers 1 and 1' of crystalline polymethylpentene. In FIG. 2, the reference numerals 3 and 3' represent adhesive layers.

The crystal polymethylpentene in the two layers (B) constituting the release film of the invention may be, for example, a crystalline homopolymer of 4-methyl-1-pentene or a crystalline copolymer of 4-methyl-1-pentene with another alpha-olefin, preferably a crystalline copolymer comprising at least 85 mole % of units of 4-methyl-1-ptentene.

The other alpha-olefin preferably has 2 to 20 carbon atoms. Examples include ethylene, propylene, 1-butene, 1-hexene, 1-octene, 1-decene, 1-tetradecene and 1-octadecene.

The crystalline polymethylpentene has a melt flow rate ($MFR^5$, determined under a load of 5 kg at a temperature of 260°) of preferably 0.5 to 200 g/10 minutes. If the melt flow rate is less than 0.5 g/10 minutes, the polymer has a high melt viscosity and therefore poor moldability. If, on the other and, it exceeds 200 g/10 minutes, the polymer has a low melt viscosity and therefore poor moldability. The flexible polyolefin constituting the interlayer (A) in the release film of the invention functions as a cushioning layer at the time of forming a flexible printed board.

Preferred examples of the flexible polyolefin include copolymers or multi-component copolymers of ethylene with alpha-oplefins such as propylene, 1-butene, 1-pentene, 1-hexene and 4-methyl-1-pentene; copolymers or multi-component copolymers of propylene with alpha-olefins such as ethylene, 1-butene, 1-pentene, 1-hexene and 4-methyl-1-pentene; copolymers of ethylene with an acrylate, a methacrylate, acrylic acid or methacrylic acid, or partial ionically crosslinked products thereof; blends of two or more copolymers of ethylene with acrylic acid or acrylates; copolymers or multi-component copolymers of 4-methyl-1-pentene with the above-mentioned alpha-olefins; and blends of the foregoing polymers with polyolefins such as polyethylene, polypropylene, poly-1-butene and poly-4-methyl-1-pentene.

Especially preferably used in view of moderate flexibility and cushioning property are the copolymers or multi-component copolymers of ethylene with the aforesaid alpha-olefins; the copolymers or multi-component copolymers of propylene with the above-mentioned olefins; and the copolymers of ethylene with acrylates, methacrylates, acrylic acid or methacrylic acid, or the partial ionically crosslinked products thereof. The flexible polyolefin may be used in one or a plurality of layers.

In the release film of this invention, the layer of crystalline polymethylpentene and the interlayer (A) may contact each other directly or through an adhesive. Likewise, the plurality of flexible polyolefin layers constituting the interlayer (A) may contact each other either directly or through an adhesive.

Figure 3:
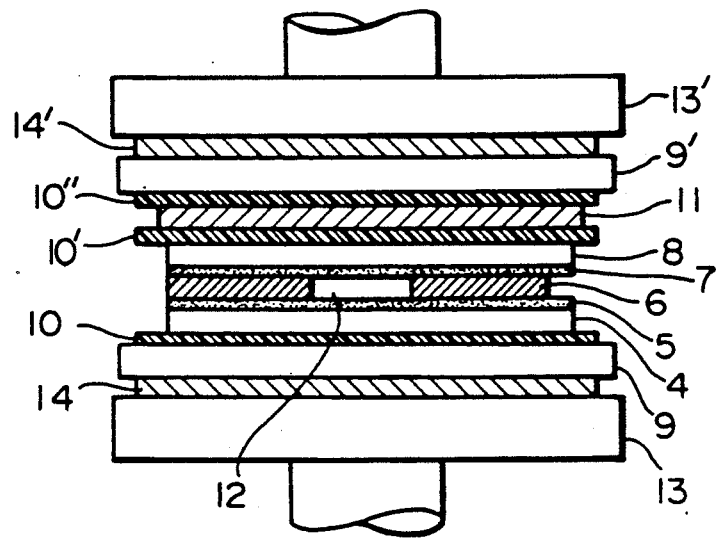
FIG. 3 is a sectional view for illustrating the molding process for a conventional flexible printed board.
Figure 4:
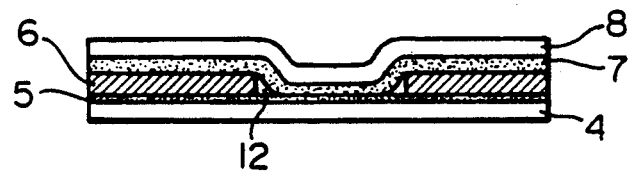
FIG. 4 is a sectional view of a flexible printed board molded by a conventional process.

The properties required of the release film of the invention and the press-forming step in the forming of a conventional flexible printed board will now be described. One example of the press-forming step in the formation of a flexible printed board having an elecrical circuit formed on one surface will be described with reference to FIG. 3. A board comprising a base film 4, an adhesive layer 5 and a copper circuit 6 is placed on a hot plate 13 of a hydraulic press device. To equalize heat and pressure at this time, a cushioning plate 14 made, for example, of kraft paper or a rubber sheet, stainless plate 9 and a release film 10 stacked successively from below are inserted between the board and the hot plate 13. Furtheremore, above the board are stacked succesively in ascending order a release film 10', a cushioning sheet 11, a release film 10'', a stainless plate 9', and a cushioning plate 14'. The entire assembly is then consolidated under heat and pressure by means of an upper hot plate 13' and the lower hot plate 13. If the softening and deformation of the cushioning film 11 are not sufficient or the flexibility of the release films 10, 10' and 10'' is insufficient, the cover-layer 8 coated with an adhesive 7 is not sufficiently pushed into a gap in the non-printed area of the board. Consequently, as shown in FIG. 4, air 12 remains in the lower end portion of the copper circiut, and the board does not intimately adhere to the coverlay.

Thus, in the conventional press-forming step, a plurality of release films or cushioning films are used in a separately stacked state in addition to the materials constituting the desired flexible printed board. Since the release films or cushioning films are thin, it is extremely difficult and troublesome to stack them without causing ceases or foldings. Furthermore, an error is liable to occur in the sequence of stacking these materials, and may result in products having poor quality.

The present inventors studied various factors for the production of a flexible printed board with a clear brounday between the bare parts of terminals and parts covered with a coverlay without the formation of gaps in the non-printed area of the boared in the step of hot pressing the coverlay. As a result, they have succeeded in obtaining a release film which serves the above purpose by selecting thermal conditions for the individual constituent materials in the hot pressing step and using materials meeting these conditions.

In the release film of this invention, the layers of crystalline polymethylpentene forming its inside and outside layers have a releasing function, and the interlayer of a flexible polyolefin has a cushioning function. These layers are bonded to each other to form a laminate. Accordingly, the release film of the invention obviates such a troublesome operation. Furthermore, since the flexible polyolefin layer has moderate cushioning property, the coverlay can be accurately pushed against the non-printed areas of the printed board in the above pressing step. As a result, an integrated gap-free flexible printed boad can be produced.

Figure 5:
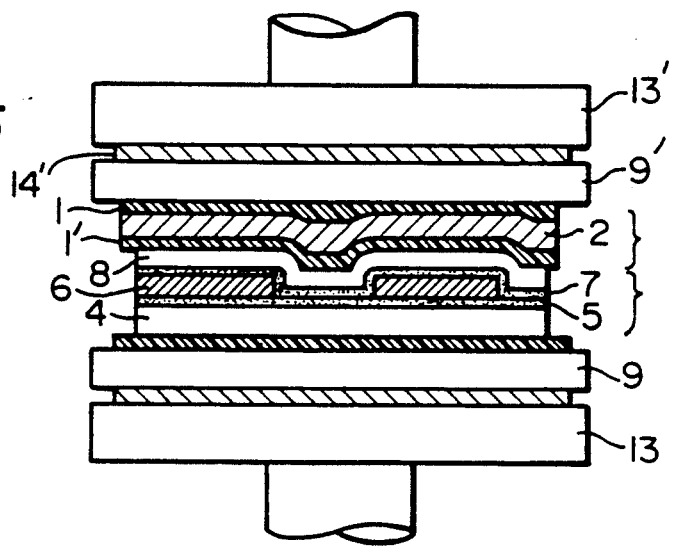
FIG. 5 is a sectional view illustrating the molding of a flexible printed board by using the release film of the invention.

FIG. 5 is a sectional view for illustrating the state of a flexible printed board II after the end of the hot-pressing in its production using the release film I of the invention. As a result of using this release film, the coverlay is completely pushed into gaps in the non-printed area to attain intimate adhesion and integration.

Figure 6:
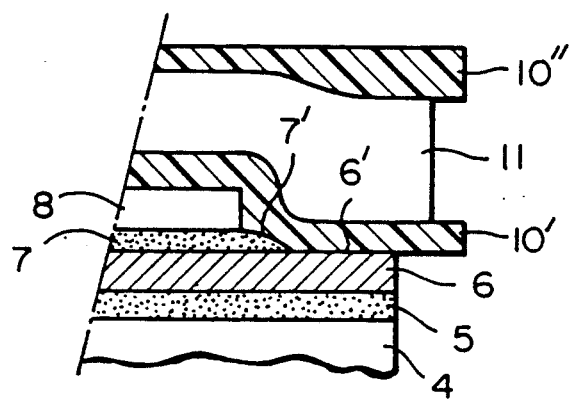
FIG. 6 is a sectional view of a bare terminal portion of a flexible printed board fabricated by a conventional process.

For electrical connection to other component parts, the flexible printed board should be produced in such a state that the copper circuit in terminal portions is exposed and bare. The conventional technique cannot form a clear complete boundary between the exposed portion and the coverlay. In the press-forming step of forming bare terminal portions in the conventional method, an adhesive 7 coated on the coverlay 8 may melt and form a flowing portion 7' at the time of hot pressing because softening and deformation of release films 10' and 10'' and a cushioning sheet 11 are insufficient. Consequently, the portion 7' cures while it covers part of the upper surface of the copper circuit 6 (see FIG. 6), and the product, in many cases, becomes unacceptable.

Figure 7:
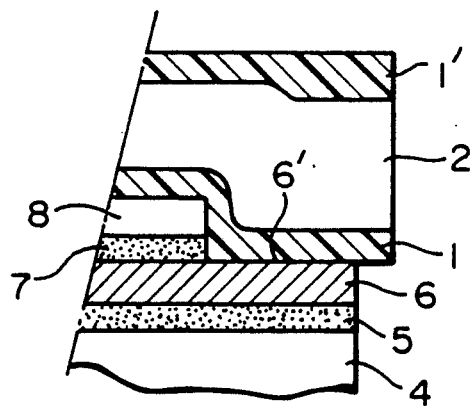
FIG. 7 is a sectional view of a bare terminal portion of a flexible printed board fabricated by using the release film of the invention.

In contrast, the release film of this invention deforms before a thermocurable adhesive coated on the coverlay begins to flow due to heat in the hot-pressing step. Furthermore, the interlayer of the sheet has excellenet cushioning property, and its inside and outside layers have excellent releasability. Accordingly, as shown in FIG. 7, the release film intimately adheres to the end surface of the coverlay 8 and the copper circuit surface 6', and the adhesive 7 does not at all flow. Thus, in the final product obtained, a clear boundary exist between the exposed portion and the coverlay.

The individual layers of tthe release film of this invention should be such that during the production of a flexible printed board, the layers show sufficient flexibility and cushioning property for the coverlay to be pushed into the gap of the non-printed area of the board in intimate adhesion. The thicknesses of the crystalline polymethylpentene layer/the flexible polyolefin layer/the crystalline polymethylpentene layer are preferably 3–100 micrometers/5–1000 micrometers/3–100 micrometers, especially preferably 5–50 micrometers/20–200 micrometrers/5–50 micrometers.

Preferably, the release film of this invention is formed usually by co-extruding the inside layer, the interlayer and the outside layer. This co-extrusion can give a laminate having excellent adhesion strength because the resins get mixed well in the molten state on the adhesion interface of the resins.

The integral laminate may slso be obtained by providing adhesive layers as shown in FIG. 2. The laminate shown in FIG. 2 may be formed by coating an adhesive such as adhesives of the urethane, isocyanate or epoxy type in film between the individual layers, and as required, press-bonding the entire assembly. As another method, the laminate may be formed by simultaneously extruding the resin layers and an adhesive resin such as maleic anhydrige-grafted polyethylene or maleic anhydride-grafted in film form between the resin layers. Alternatively, the laminate may be prepared by performing three layers in film or sheet form, and hot bonding or hot rolling them in the order described above.

The following examples illustrate the present invention more specifically.

EXAMPLE 1

A copolymer of 4-methylpentene-1 and 1-decene having a density of 0.84 and an $MFR_1$ (ASTM D1238; 260° C., a load 5 kg) of 23 g/10 minutes was used or release resin layers B1 and B2. Resin B1 was introduced into a first extruder and the resin B2, into a second extruder. They were each plasticized at 300° C. and a three-layer co-extrusion T-die of the multimanifold type.

As a cushioning layer resin A1, a propylene/butnene-1 copolymer having a density of 0.89, an $MFR_2$(ASTM D1238, condition E) of 3 g/10 minutes and a Vicat softening temperature of 78° C. was plasticized at 300° C. in a second extruder, and introduced into the three-layer co-extrusion T-die of the multimanifold type.

The resins B1/A1/B2 were combined in the coextrusion T-die, and taken up at a rate of 30 m/min. to form a three-layer film having a total thickness of 150 micrometers in which the thicknesses of the layers B1, A1 and B2 were 25, 100 and 25 micrometers, respectively. The adhesion strength of the film between layers B1 and A1 and between layers A1 and B2 were 350 g/15 mm and 530/15 mm, respectively. These adhesion strengths were enough for practical application.

The three-layer film was set at the position I in a hot press shown in FIG. 5, and a coverlay 8 composed of a polyimide film having a thickness of 25 micrometers and coated in a thickness of 30 micrometers with an epoxy-type adhesive having a flow initiation temperatre of 80° C. was hot-pressed against a board at a temperature of 150° C. under a pressure of 20 kg/cm² for 30 minutes.

The coverlay in the resulting product completely adhered intimately to the board, and air did not remain inside the product.

EXAMPLE 2

A three-layer film having a total thickness of 150 micrometers was produced by the same procedure as in Example 1 except that an ethylene/ethyl acrylate copolymer having an ethyl acrylate content of 15%, an $MFR_2$ of 0.5 g/10 minutes and a Vicat softening temperature of 65° C. was used as the cushioning layer resin A2. The adhesion strengths of the resulting film between layers B1 and A2 and between layers A2 and B2 were 205 g/15 mm and 200 g/15 mm. These strengths were sufficient for practical application.

Under the same conditions as in Example 1, the three-layer film was used in the hot pressing step, and a coverlay was hot-pressed against the board.

In the resulting of product, the coverlay completely adhered intimately to the board, and air did not remain inside the product. The flowing of the adhesive onto the surface of the copper foil in a portion having no coverlay was to an extent less than 0.1 mm from the coverlay. The flow preventing effect of the laminated film was good.

EXAMPLE 3

A three-layer film having a total thickness of 150 micrometers was produced by the same procedure as in Example 1 except that a blend (Vicat softening temperature 70° C.) composed of 50% by weight of a ternary polymer of propylene/1-butene/4-methyl-1-pentene having a propylene content of 35 mole %, a 1-butene content of 14 mole % and a 4-methylpentene-1 content of 50 mole %, a glass transition temperature of 5° C., a density of 0.860, an $MR_2$ of 0.88 g/10 minutes and a crystallinity, determined by X-rays, of 1.2% and 50% by weight of linear low-density polyethylene was used as a cushioning layer resin A3. The film could not be peeled between layers B1 and A3 and between A3 and B2, and the adhesion strength of the film could not be measured.

By using the resulting three-layer film in the hot-pressing step under the same conditions as in Example 1, the coverlay was hot-pressed to the board. In the resulting product, the coverlay completely adhered intimately to the board, and air did not remain inside the resulting product.

The flowing of the adhesive onto the surface of the copper foil in a portion having no coverlay was to an extent less than 0.1 mm from the coverlay. The flow preventing effect of the laminated film was good.

EXAMPLE 4

A copolymer of 4-methylpentene-1 (95% by weight) and 1-decene (5% by weight) having a density of 0.84 and an $MFR_2$ of 23 g/10 minutes was used as a release layer resin B3, plasticized at 300° C. in a first and a fifth extruder, and introduced into a five-layer co-extrusion T-die of the multimanifold type. As a cushioning layer resin A4, an ethylene/1-butene random copolymer having a melt flow rate of 4 g/10 min., a density of 0.886 g/cm³, a melting point of 69° C. and an ethylene content of 80% by weight was plasticized at 260° C. in a second and a fourth extruder. As a central layer A2, the same copolymer of etylene and ethyl acrylate (15% by weight) as used in Example 2 was used, and introduced into the five-layer coextrusion T-die.

In the coextrusion T-die, resin layers B3, A4, A2 A4 and B3 were combined, and taken up at a rate of 20 m/min. to produce a five-layer film having a total thickness of 180 micrometers in which the thicknesses of the layers B3, A4, A2, A4 and B3 were 20, 20, 100, 20 and 20 micrometers, respectively. The adhesion strengths of the film between layers B3 and A4, A4 and A2, A3 and A4, and also between A4 and B3 were 510 g/15 mm, 210 g/15 mm, 220 g/15 mm, and 520 g/15 mm. These adhesion strengths were sufficient for practical application.

COMPARATIVE EXAMPLE 1

As a release film B', single-layer polyvinyl fluoride films having a thickness of 25 micrometers were used, and as a cushioning film A', a single layer low-density polyethylene film having a density of 0.919, a MFR atr 190° C. of 0.35 g/10 minutes and a Vicat softening temperature of 92° C. was used. In FIG. 3, the films B', A' and B' were set in this order at positions 10', 11 and 10", and under the same conditions as in Example 1, a coverlay was hot-pressed against a board. In the resulting product, the coverlay did not adhere intimately to part of the lower end portion of the copper circuit in the board.

The flowing of the adhesive onto the surface of the copper foil in a portion having no coverlay was to an extent 0.5 mm from the coverlay. The flow preventing effect of the laminated film could not be said to be good.

We claim:

1. A release film composed of a laminate comprising (A) a layer of flexible polyolefin as an interlayer, and
(B) two layers formed on both sides of the interlayer said two layers consisting essentially of crystalline polymethylpentene.

2. The release film of claim 1 in which the flexible polyolefin is a copolymer or multi-component copolymer of alpha-olefins selected from the groups consisting of ethylene, propylene, 1-butene, 1-pentene, 1-hexene and 4-methyl-1-pentene.

3. The release film of claim 1 in which the flexible polyolefin a copolymer selected from the group consisting of copolymers of ethylene and acrylates or methacrylates, a copolymer of ethylene with acrylic or methacrylic acid, and partially ionically crosslinked products of these copolymers.

4. The release film of claim 1 in which the crystalline polymethylpentene is a homopolymer of 4-methylpentene-1, or a copolymer of 4-methylpentene-1 with another alpha-olefin.

5. The release film of claim 1 in which the interlayer is composed of a plurality of layers of the flexible polyolefin.

* * * * *